United States Patent [19]
Akram et al.

[11] Patent Number: 6,072,236
[45] Date of Patent: Jun. 6, 2000

[54] MICROMACHINED CHIP SCALE PACKAGE

[75] Inventors: Salman Akram; David R. Hembree, both of Boise; Warren M. Farnworth, Nampa, all of Id.

[73] Assignee: Micron Technology, Inc., Boise, Id.

[21] Appl. No.: 08/612,059

[22] Filed: Mar. 7, 1996

[51] Int. Cl.[7] .......................... H01L 23/04; H01L 29/40; H01L 23/48; H01L 23/52
[52] U.S. Cl. .......................... 257/698; 257/621; 257/735; 438/611; 438/612
[58] Field of Search .............................. 257/698, 48, 621, 257/737, 735, 685, 686, 777; 437/208, 915, 183, 289; 438/614, 612, 613

[56] References Cited

U.S. PATENT DOCUMENTS

| | | | |
|---|---|---|---|
| 4,542,397 | 9/1985 | Biegelsen et al. | 148/1.5 |
| 5,018,002 | 5/1991 | Neugebauer et al. | 257/698 |
| 5,136,364 | 8/1992 | Byrne | 257/782 |
| 5,248,797 | 9/1993 | Sum | 552/205 |
| 5,248,903 | 9/1993 | Heim | 257/748 |
| 5,262,927 | 11/1993 | Chia et al. | 361/784 |
| 5,291,064 | 3/1994 | Kurokawa | 257/714 |
| 5,424,652 | 6/1995 | Hambree et al. | 324/765 |
| 5,441,917 | 8/1995 | Rostoker et al. | 437/195 |
| 5,481,135 | 1/1996 | Chandra et al. | 257/701 |
| 5,508,230 | 4/1996 | Anderson et al. | 257/796 |

FOREIGN PATENT DOCUMENTS

| | | | |
|---|---|---|---|
| 6-37157 | 2/1994 | Japan | 257/48 |

*Primary Examiner*—Mahshid Saadat
*Assistant Examiner*—Jhihan B. Clark
*Attorney, Agent, or Firm*—Task, Britt, & Rossa

[57] ABSTRACT

A chip scale package comprised of a semiconductor die having a silicon blank laminated to its active surface. The bond pads of the die are accessed through apertures micromachined through the blank. The package may be employed with wire bonds, or solder or other conductive bumps may be placed in the blank apertures for flip-chip applications. Further, the package may be employed to reroute external connections of the die to other locations, such as a centralized ball grid array or in an edge-connect arrangement for direct or discrete die connect (DDC) to a carrier. It is preferred that the chip scale package be formed at the wafer level, as one of a multitude of packages so formed with a wafer-level blank, and that the entire wafer be burned-in and tested to identify the known good die (KGD) before the wafer laminate is separated into individual packages.

49 Claims, 3 Drawing Sheets

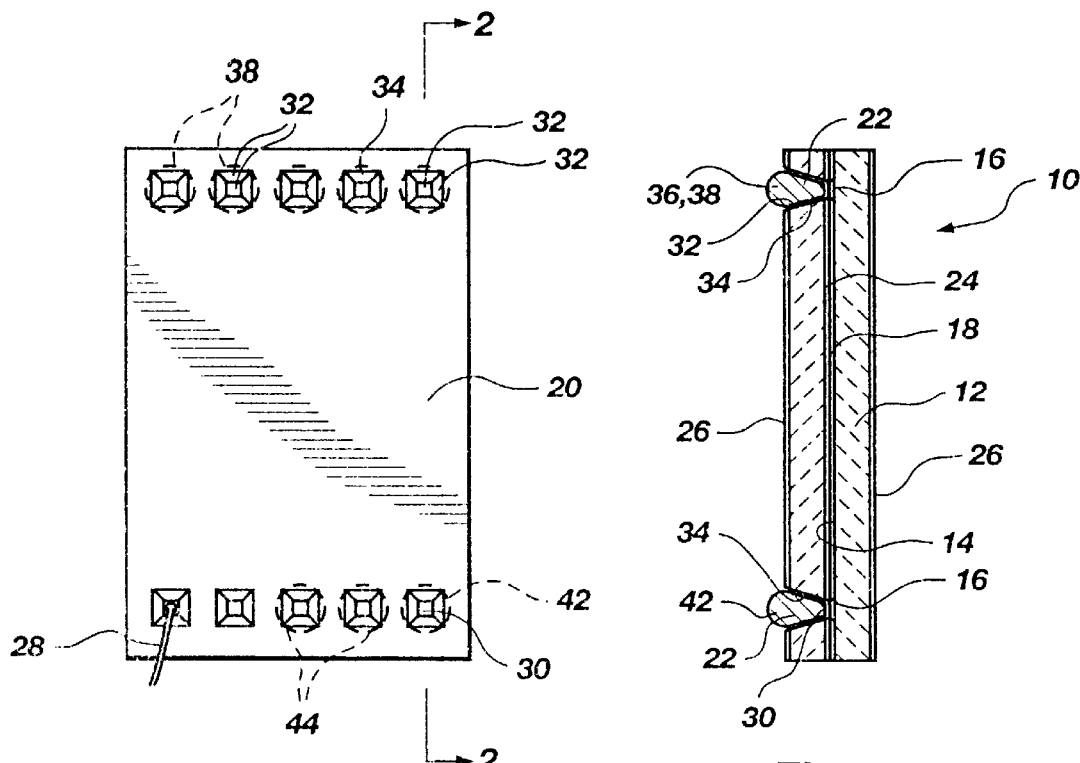
Fig. 1
Fig. 2
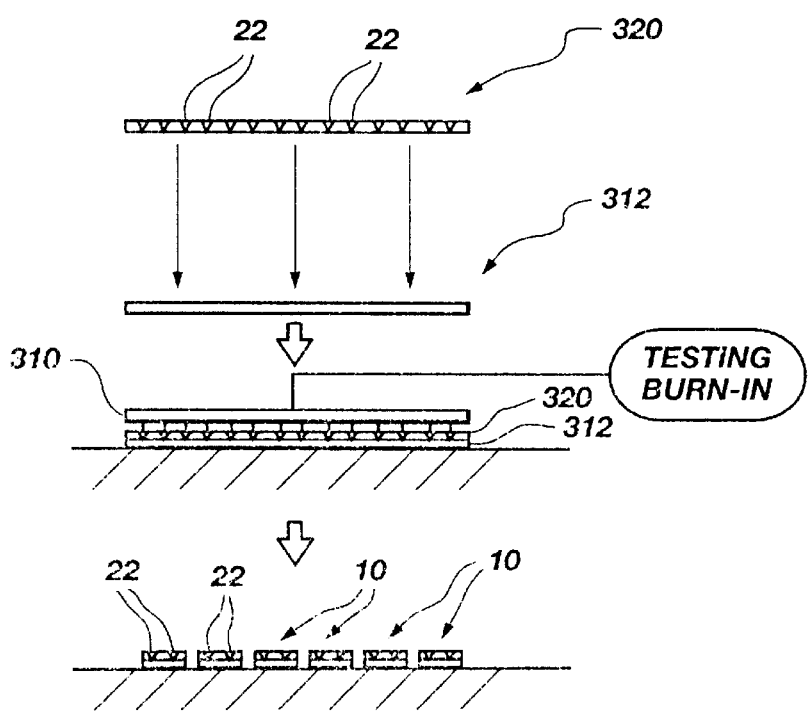
Fig. 2A

MICROMACHINED CHIP SCALE PACKAGE

BACKGROUND OF THE INVENTION

1. Field of the Invention

The present invention relates generally to packaging and, more specifically, to a laminated chip scale package formed of a die and a micromachined silicon wafer segment or blank bonded to the active surface of the die. The package may be executed at the wafer level.

2. State of the Art

Packaging for semiconductor dies takes a variety of forms. Transfer-molded packages, comprising a filled polymer encompassing a die wire-bonded or otherwise electrically connected to a lead frame, are prevalent in today's market. Other types of packaging, such as preformed ceramic or even metal packages, in which die are secured and then placed in electrical communication with package conductors, are also employed. Similarly, so-called "glob-top" encapsulation (with an epoxy, silicone gel, polyimide, and other organic, plastic and the like) of dies mounted and usually wire-bonded to a substrate such as a printed circuit board is also widely employed. Underfill of a flip-chip mounted to a substrate is also known in the art; such procedure may be followed by glob-topping the assembly. It has also been suggested to hermetically protect integrated circuits (dies) with a silicon-containing ceramic layer; see U.S. Pat. No. 5,481,135.

All of the foregoing packaging schemes, however, suffer from one or more deficiencies. For example, plastic packaging with lead frames and wire bonds is a multi-step process, wherein a defectively-performed individual step may compromise the quality of the end product if any individual step is deficient. Moreover, matching of the coefficients of the thermal expansion (CTE) of die, lead frame and encapsulant is virtually impossible, requiring additional structural features or process steps to accommodate thermally-induced stresses. Further, plastic packages do not provide a hermetic seal, e.g., are not effective to prevent the ingress of moisture to the package interior. Ceramic and metal packages provide hermetic protection, but are expensive and require as many if not more process steps as a transfer-molded plastic package.

Glob-topping a die is relatively easy, but the resulting protection for the die and conductors is less than robust in comparison to other alternatives. Underfilling of a flip-chip connection followed by glob-topping is process-intensive and suffers from quality control constraints due to an inability to verify the integrity of the underfill. With the exception of ceramic and metal packages, all of the current packaging alternatives, including application of a ceramic layer to the surface of a die, may fail to provide a hermetic seal of any quality or repeatability for the die. Moreover, most current die packages are far more massive in both lateral and vertical extent than the die itself, thus absorbing valuable "real estate" on the substrate or other carrier to which the die is mechanically attached and electrically connected, and increasing the size of the external circuit in which the die is incorporated.

So-called "direct" die attach (DDA) or "discrete" or "direct" die connect (DDC) configurations have been developed to facilitate the direct connection of one or more unpackaged or "bare" die to the next level of packaging. Such schemes may simply use a variation of a flip-chip die attach, may actually employ an intermediate substrate carrying more than one die to effect the connection to a carrier, or may use an "edge-connect" arrangement to mechanically and electrically connect vertically-oriented die to a carrier. These approaches, while meritorious from a space-saving standpoint, subject the bare die itself to potential damage during handling and execution of the die-connect, as the relatively delicate active surface of the die, with its active and passive devices as well as a myriad of conductive traces, is placed at risk. Moreover, configuring dies with a bond pad arrangement suitable for an edge-connect is no small feat, given the necessity of placement of all of the external connections for accessing the die at one edge thereof. Thus, some edge-connect approaches are a compromise of a true direct die connect by virtue of using a larger, conductor-carrying film or board to effect the edge connections.

In summary, state-of-the art packaging schemes fail to achieve reliable, substantially hermetic die protection on a size scale of the die itself, which the inventors herein term a "chip scale" package. Moreover, state-of-the-art packaging schemes fail to provide a technique to reliably effectuate a chip scale DDC with hermetic die protection.

SUMMARY OF THE INVENTION

The present invention comprises a chip scale package which may be fabricated at the wafer level, and which provides hermetic protection for the die. The invention may also be used to reroute bond pads for flip-chip direct die connect (DOC) and direct die attach (DDA) use, and the package structure itself is advantageous for the formation and use of solder or conductive epoxy balls or bumps in a flip-chip format. Further, the package is readily adaptable to the stacking of dies to form multi-die circuits.

In its elemental form, the package of the present invention comprises a bare semiconductor or integrated circuit die having a micromachined silicon segment or blank bonded to its face. With the exception of the bond pad locations, the active surface of the die is passivated with an insulative layer by formation of an oxide or nitride layer thereon, after which the silicon blank is aligned with and bonded to the die, micromachined apertures extending through the blank being aligned with the bond pads of the die. The exterior of the entire package is then passivated as, for example, by nitriding or oxidizing, after which the nitride is removed from the bond pads as Tab Automated Bonding known in the art. The package is, at that point, ready for wire-bonding or (TAB) conductor attach.

If desired, copper may be electrolessly plated onto the bond pads of the micromachined apertures as known in the art, or a multi-layer "sandwich" coating of Cr, Cr/Cu and Cu formed over the bond pads and the adjacent walls of the apertures. This treatment of the package structure is then followed by stencilling or screen-printing of solder over and into the apertures, followed by reflow to form solder balls of a ball grid array, or BGA. Alternatively, conductive polymer bumps or columns may be stencilled or printed over and into the apertures to define conductive bumps, or bump-type contacts may be electrolessly plated into the apertures.

The package of the invention may be employed to move or reroute bond pad locations in several ways. For example, the die may be formed with circuit traces on its active or "face" side, leading from the original bond pads at the die periphery or in a central row to alternate bond pad locations (in an area array, for example) accessed through the apertures of the blank. The original bond pad locations may also be deleted during die fabrication and circuit traces configured to lead to different bond pad locations. Alternatively, the back side of the blank may be used to repattern the bond pad pattern by stencilling of conductive traces extending from the bond pad locations of the die to new locations accessible through apertures formed in the blank. In yet another approach, the bond pad or terminal locations may be moved by accessing the die bond pads through micromachined apertures in the blank communicating with trenches micromachined in the face side of the blank, which trenches lead to new pad locations also formed in the blank's face side. The trench surfaces and new bond pads may then be metallized for electrical communication. In such a manner, closely-spaced bond pads unsuitable for flip-chip bonding may be transformed into a wider pitch area array easily susceptible to employment in a flip-chip mounting scheme.

In yet another variation of the invention, the blank may be micromachined with a number of mutually parallel, extended grooves along and perpendicular to one edge of the package. The grooves, which may communicate directly with the bond pads of the die, or with rerouting traces on the face side of the die or the back side of the blank extending from original bond pad locations to new ones along one edge of the package, may be conductively coated to function as connectors when the package is "plugged" transversely into a carrier having slots with mating conductive clips or other elements to receive and connect to the die of the package in a DDC assembly. Alternatively, the trenches may function merely as alignment elements for the clips, which contact the new bond pads associated with the trenches.

While the invention, and its many variations, have heretofore been discussed literally on a "chip" or die scale, it will be understood and appreciated by those of ordinary skill in the art that the invention may be most efficiently practiced in its method aspect on a wafer scale. That is to say, it is preferred that an entire wafer of active device dies be processed according to the invention in combination with a blank of wafer size, so that all method steps, including burn-in and testing of the "macro" scale package including a multitude of packages, be performed before the packages are singulated. It is also contemplated that packages may be defined as comprising multiple, unseparated dies, or partial wafers, in combination with like-sized blanks and associated conductors to provide external access to the circuit with which the multiple dies are to be employed. Thus, a multi-chip module (CM) such as a single in-line memory module (Same) may be replaced by a multi-die package according to the present invention. Similarly, processors which are to be paralleled may also be formed side-by-side in a single package with all required conductors. Further, packages according to the invention may be attached face-to-face against opposing sides of a conductor-carrying substrate, or face-to-face against each other, and employ suitable edge-connect structure for external connections to a circuit.

BRIEF DESCRIPTION OF THE DRAWINGS

The present invention will be more fully appreciated by those of ordinary skill in the art by a review of the detailed description of the preferred embodiments, taken in conjunction with the accompanying drawings, wherein:

FIG. 1 comprises a top elevation of a first preferred embodiment of a chip scale package according to the present invention;

FIG. 2 comprises a side sectional elevation of the package of FIG. 1, taken along line 2—2;

FIG. 2A comprises a schematic depicting the assembly, burn-in and testing, and singulation of packages according to the present invention fabricated on a wafer scale;

DETAILED DESCRIPTION OF THE PREFERRED EMBODIMENT

Figure 3:
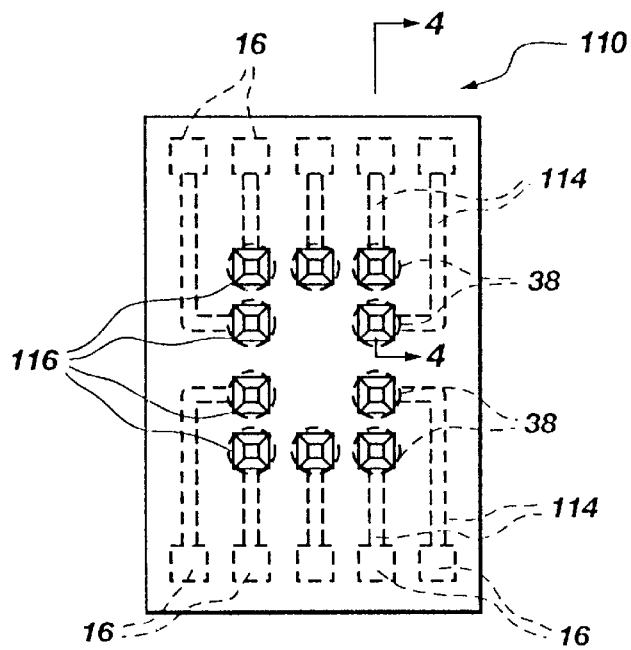
FIG. 3 comprises a top elevation of a second preferred embodiment of a chip scale package according to the present invention.

FIGS. 1 and 2 depict one preferred embodiment of a package 10 according to the present invention, including die 12 carrying an integrated circuit, as well known in the art, comprised of a plurality of active devices in combination with selected passive devices (resistors, capacitors, etc.) as desired on its face side or active surface 14. A dynamic random access memory circuit is exemplary of such an integrated circuit, although circuits of any type or for any function, such as processors, formed on dies may be packaged according to the invention. The integrated circuit electrically communicates with an external circuit in which it is employed through a plurality of contacts, commonly termed bond pads 16, located on active surface 14. Package 10 is fabricated by passivating the active surface 14 of die 12, as known in the art, by oxidizing or nitriding to form a silicon dioxide or silicon nitride layer 18 or a combination of the two. Spin on glass (SOG) or polyimide can also be used. Silicon blank 20, through which apertures 22 have been anisotropically etched as known in the art, is then placed over active surface 14 of die 12. Apertures 22 have been etched in a pattern corresponding to that of bond pads 16, and blank 20 is aligned with die 12 so that apertures 22 open into bond pads 16. Blank 20 is bonded or fused to die 12 by any one of a number of materials 24 known in the art, including, by way of example only, boron phosphorous silicate glass (BPSG), polymer adhesives such as epoxies, reflowable glass, photoresists, and polyimides. The entire exterior of the resulting laminate is then passivated, again as by nitriding or oxidizing (using techniques such as plasma-enhanced chemical vapor deposition or PECVD, for example), resulting in a passive exterior layer 26. The nitride is then removed from the bond pads 16, and package 10 is ready for wire bonding. An exemplary wire bond 28 is depicted in one aperture 22 in FIG. 1.

If solder bumping of the bond pads 16 is to be effected, it is desirable to provide a solder-wettable surface on bond pads 16. This may be achieved by electroless plating of a copper layer 30 on bond pads 16 or, more preferably, for better metallization adhesion and greater solder-wettable surface area, by deposition of a Cr, Cr/Cu, Cu multi-layer or sandwich coating 32 (see FIG. 1) on bond pads 16 and walls 34 of apertures 22. The latter type of coating may be effected by sputtering, plasma-enhanced chemical vapor deposition (PECVD), or chemical vapor deposition (CVD), as known in the art, and requires subsequent removal of the coating from the surface of the package 10 while the aperture wall 34 and bond pad 16 areas are protected by a resist. Such removal may be rapidly and accurately effected by chemical mechanical polishing (CMP) techniques as known in the art. Solder paste 36 (typically 95% Pb/5% Sn) may then be stencilled into apertures 22, and then heated to reflow, as known in the art. The metallized aperture walls 34, being solder-wettable, as noted above, aid in defining the solder "ball" 38 protruding from the package after reflow. The angle of walls 34 to the horizontal formed using a preferred anisotropic wet etch such as a KOH:H$_2$O mixture is approximately 54° to the horizontal, or plane of the active surface 14, and provides improved strength during solder ball 38 formation by increasing surface area exposed to shear forces.

As an alternative to solder bumping, electrolessly-plated bumps or contacts 42 may be formed in apertures 22 as known in the art. Such a conductive structure renders package 10 especially suitable for tab automated bonding (TAB) applications, wherein the terminal ends of a conductor-carrying, flexible, dielectric film (typically a polyimide) are gang-bonded to the contacts (pads, or in this case, bumps) of a die. Similarly, conductive polymer bumps or pillars 44, such as silver-filled epoxies, may also be deposited, as by stencilling, into apertures 22.

It will be readily understood by those of ordinary skill in the art that the above-described fabrication procedure is preferably carried out at the wafer level for commercial production. That is (see FIG. 2A), a wafer-sized blank 320 is appropriately micromachined (etched) with the desired pattern of apertures 22 to correspond to a large plurality of dies 12 to be found on a typical wafer 312. The wafer-sized blank 320 is then aligned with and laminated to the wafer 312 after the latter has been passivated. Following lamination, the assembly 310 exterior is passivated, and any further bond pad/aperture wall metallization effected, after which conductive bumps or balls may be formed as described above. Ideally, the wafer-sized assembly 310 is then subjected to electrical testing and burn-in before the wafer assembly 310 is sawn to singulate the packages 10, thus providing packaged known good die (KGD) upon singulation. As previously alluded, packaged die 10 may be severed from the wafer assembly 310 singularly, or in groups, as desired. It is also contemplated that an entire unsevered wafer assembly 310 may be tested and burned-in and then used as fabricated as a wafer-scale package, particularly for large-capacity memory requirements.

Further, while blank 20 has been characterized as being comprised of silicon (e.g, a wafer blank), it will be recognized by those skilled in the art that the invention is not so limited. For example, certain ceramics and mullites having suitable CTE's may be employed. Further, if the die-bearing wafer is of GaAs, a wafer of like material is also obviously suitable. The significant requirement for the package blank is its susceptibility to highly accurate micromachining, mechanical properties compatible with those of the die-bearing wafer, lack of adverse electrical characteristics, and bondability to the latter using normal bonding materials and techniques.

Additional preferred embodiments of the invention are described hereafter, the same reference numerals being used to identify previously-noted elements and corresponding elements in each drawing figure.

Figure 4:
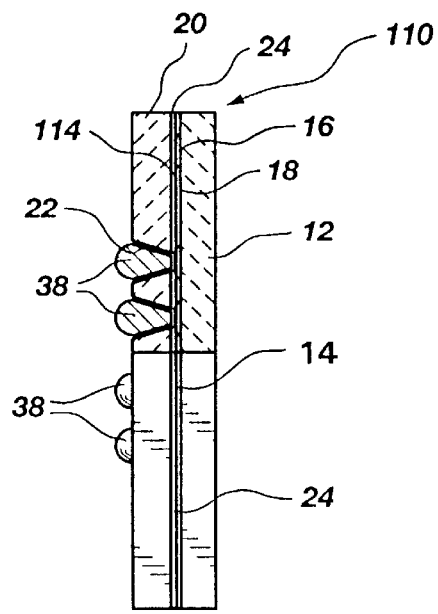
FIG. 4 comprises a partial side sectional elevation of the package of FIG. 3, taken along line 4—4.

FIGS. 3 and 4 depict another preferred embodiment 110 of the package of the invention. In package 110, a die 12 is employed as before. However, circuit traces 114 have been applied by means well known in the art to the face side 14 of die 12 over passivation layer 18 to reroute the external connection locations of die 12 from bond pads 16 to new, relocated bond pads 116. Blank 20 is then micromachined or etched with apertures 22 in locations corresponding to the locations of new bond pads 116. Thus, a die 12 having fine-pitch peripheral bond pads 16 or a central row of such bond pads 16 and thus being unsuitable for flip-chip bonding due to pitch imitations of solder or other conductive bumps may be reconfigured or retrofitted with more widely-spaced or larger-pitched bond pads 116 in an area array, for example, at the center of the die 12 as shown. Thus, dies carrying a variety of bond pad patterns (for example, peripheral versus central row) may be standardized in their external connection arrangements.

Figure 5:
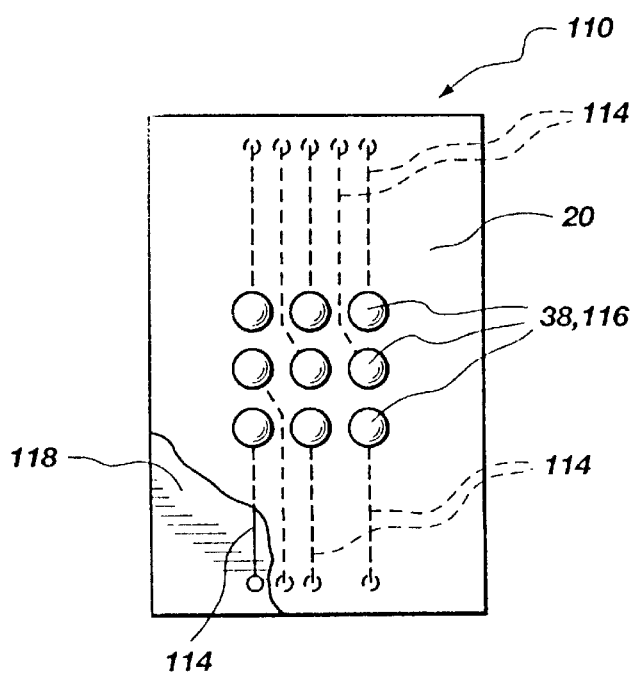
FIG. 5 comprises a top elevation of a third preferred embodiment of a chip scale package according to the present invention.

A logical extension of the embodiment 110 of FIGS. 3 and 4, as shown in FIG. 5, is to reroute the circuit traces 114 of die 12 during fabrication thereof, rather than subsequent thereto as described above, so that only the new bond pads 116 are present, original bond pads 16 being eliminated. Such an approach may well require formation of an extra or intermediate surface passivation layer 118 on the die face side, or dielectric coating as by a spin-on polyimide followed by formation of traces 114, but such operation is easily effectuated by equipment and technology usually already used in the fab.

It is also contemplated that rerouting circuit traces 114 and new bond pads 116 may be formed on the back side of blank 20, as by stencilling of a conductor or adherence thereto of a conductor-carrying dielectric film, and the blank 20 etched through from its face side to form apertures 22 at the new bond pad locations.

Figure 6:
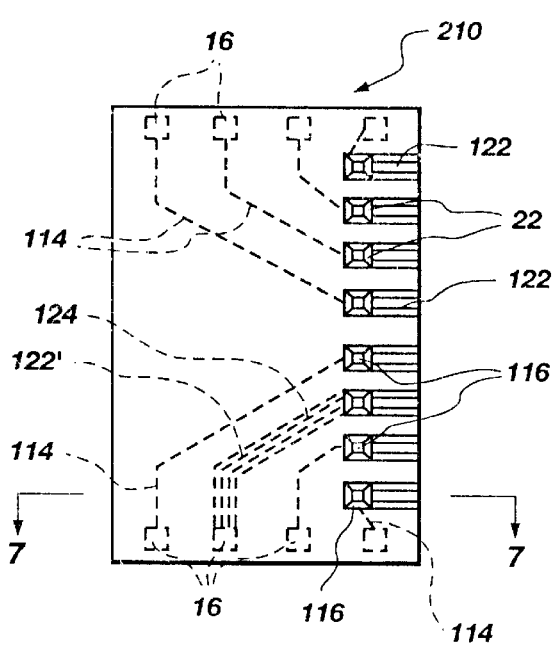
FIG. 6 comprises a top elevation of a fourth preferred embodiment of a chip scale package according to the present invention.
Figure 7:
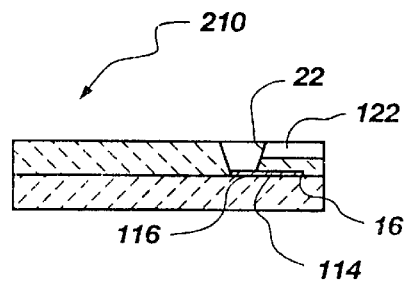
FIG. 7 comprises a side sectional elevation of the package of FIG. 6, taken along line 7—7.
Figure 8:
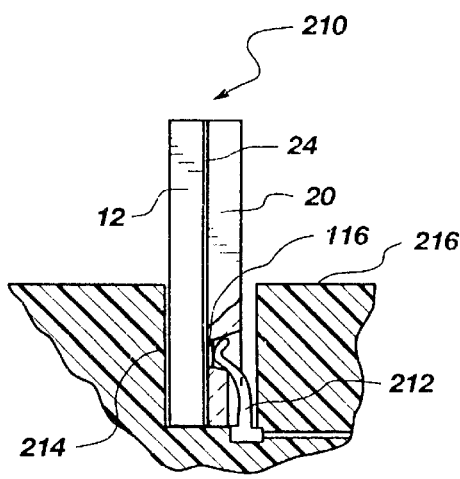
FIG. 8 is a schematic partial sectional illustration of the package of FIGS. 6 and 7 in a DDC arrangement.

Yet another preferred embodiment 210 of the invention is depicted in FIGS. 6 and 7, wherein bond pads 16 are rerouted by circuit traces 114 to new bond pads 116 onto which apertures 22 of a blank 20 open. In this instance, however, the bond pads 16 are rerouted to new bond pads 116 adjacent the edge of package 210 for a DDC-type connect to a carrier 216, as schematically depicted in FIG. 8. Shallow, mutually parallel trenches 122 perpendicular to an edge of package 210 may be machined (etched) in communication with apertures 22 having new bond pads 116 at the bottoms thereof. This structure aids in the alignment of connector clips 212 disposed in a slot 214 of a carrier 216 for contact with new bond pads 116 and establishment of electrical communication with conductors 218 of the carrier 216. Alternatively, each trench 122 may be metallized in communication with its associated new bond pad 116 as previously described with respect to preparation for solder bumping, although the preferred materials may differ since no solder-wettability is required. Thus, metallized trenches, rather than bond pads 116, may serve as external electrical connections for package 210. Further, the trenches 122 may actually extend all the way from the original bond pads 16 to the package edge as shown in broken lines 122' on FIG. 6, with appropriate metallization of the trench providing a conductive path on the face side of blank 20. Such trenches would extend all the way through blank 20 to communicate with bond pads 16, but then would rise to a shallower depth thereafter to place the material of the blank between the trench circuit trace and the underlying die 12. In this instance, the apertures 22 and all but the portion of trench 122 to be electrically contacted may be subsequently covered or filled with a protective dielectric 124 such as a polyimide or a photoresist. It should be noted that the vertical stacking arrangement of FIG. 8, if employed with multiple dies, enables greater circuit density per surface area of carrier to be achieved.

Figure 9:
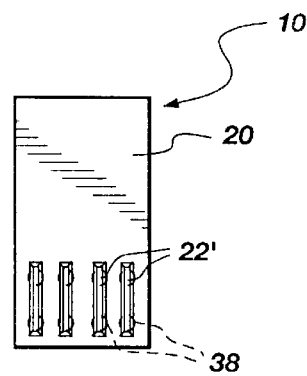
FIG. 9 is a top elevation of a fifth preferred embodiment of a chip scale package according to the invention.

It is also contemplated that the apertures passing through the blank of package 10 may be formed as extended grooves or trenches 22' passing over a plurality of bond pads, rather than as discrete, one-per-bond pad apertures, if desired. In such a case, conductive bumps such as solder balls 38 may be formed at desired locations along each groove. See FIG. 9.

Figure 10:
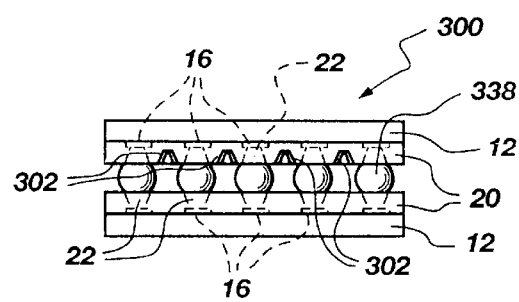
FIG. 10 is a side schematic elevation of two packages according to the present invention assembled by flip-chip type attach in a face-to-face stack.

It is further contemplated that packages according to the invention may be employed in face-to-face die or even wafer stacking as depicted in FIG. 10, wherein solder or conductive epoxy connections 338 are made between facing packages 10 to form an assembly 300, and external connections 302 of the assembly may be in the form of metallized traces extending on the surface of, or in trenches in the surface of, the blanks 20 of one or both packages 10.

It is notable that the use of the present invention for so-called "flip chip" attachment of a package to the terminals of a carrier such as a printed circuit board or ceramic substrate with conductors may be effectuated without the subsequent underfill required by the prior art, as no additional protection is required for the die and circuitry of the package of the invention.

While the invention has been described in terms of certain preferred and illustrated embodiments, it is not so limited. Those of ordinary skill in the art will recognize and appreciate that many additions, deletions and modifications may be made to the embodiments as disclosed herein without departing from the scope of the invention as hereinafter claimed.

What is claimed is:

1. A chip scale package for a semiconductor die, comprising:
   at least one semiconductor die including an integrated circuit having external electrical connections on an active side thereof; and
   a discrete preformed blank having a surface area no larger than a size of said at least one die, placed over said active side of said at least one die and including apertures formed therein through which said external connections of said at least one die are accessible, wherein at least some of said apertures are placed in said blank at locations remote from said external electrical connections.

2. The package of claim 1, further including circuit traces extending from said external electrical connections to said remote aperture locations.

3. The package of claim 2, wherein said circuit traces are at least partially formed on said active surface of said at least one die.

4. The package of claim 2, wherein said circuit traces are at least partially formed on said blank.

5. The package of claim 2, further including bond pads formed under said apertures at said remote locations.

6. The package of claim 2, further including remote external connection elements at said remote locations adjacent an edge of said package.

7. The package of claim 4, wherein said circuit traces are at least partially formed on a side of said blank adjacent said at least one die.

8. The package of claim 4, wherein said circuit traces are at least partially formed on an exposed side of said blank.

9. The package of claim 8, wherein said circuit traces are at least partially formed in trenches.

10. The package of claim 5, wherein said remote locations are arranged adjacent an edge of said package.

11. The package of claim 10, further including a trench in an exposed side of said blank extending from at least some of said remote bond pad apertures toward said package edge.

12. The package of claim 6, wherein said remote external connection elements comprise metallized trenches in an exposed side of said blank.

13. The package of claim 12, wherein said trenches extend to said external connections of said at least one die, define said circuit traces, and communicate with said external connections of said at least one die.

14. A chip scale package for a semiconductor die, comprising:
   at least one semiconductor die including an integrated circuit having external electrical connections on an active side thereof; and
   a discrete preformed blank having a surface area no larger than a size of said at least one die, placed over said active side of said at least one die and including apertures formed therein through which said external connections of said at least one die are accessible and said at least one semiconductor die further including bond pads accessible through said apertures at locations remote from said external die connections and in electrical communication therewith through circuit traces.

15. The package of claim 14, wherein said apertures are filled with a conductive material selected from the group comprising: solder, a conductive polymer, and a plated metal.

16. The package of claim 15, further including a metal layer over said bond pads and under said conductive material.

17. The package of claim 16, wherein walls of said apertures are covered with said metal layer.

18. A chip scale package for a semiconductor die, comprising:
   at least one semiconductor die including an integrated circuit having external electrical connections on an active side thereof; and
   a preformed blank having a surface area no larger than a size of said at least one die, placed over said active side of said at least one die and including apertures formed therein through which said external connections of said at least one die are accessible, wherein at least some of said apertures are placed in said blank at locations remote from said external electrical connections, and having circuit traces extending from said remote apertures locations to said external electrical connections.

19. The package of claim 18, wherein said circuit traces are at least partially formed on said active surface of said at least one die.

20. The package of claim 18, wherein said circuit traces are at least partially formed on an exposed side of said blank.

21. The package of claim 18, further including bond pads formed under said apertures at said remote locations.

22. The package of claim 18, further including remote external connection elements at said remote locations adjacent an edge of said package.

23. The package of claim 20, wherein said circuit traces are at least partially formed in trenches.

24. The package of claim 21, wherein said remote locations are arranged adjacent an edge of said package.

25. The package of claim 24, further including a trench in an exposed side of said blank extending from at least some of said remote bond pad apertures toward said package edge.

26. The package of claim 22, wherein said remote external connection elements comprise metallized trenches in an exposed side of said blank.

27. The package of claim 25, wherein said trenches extend to said external connections of said at least one die, define said circuit traces, and communicate with said external connections of said at least one die.

28. A chip scale package for a semiconductor die, comprising:
   at least one semiconductor die including an integrated circuit having external electrical connections on an active side thereof; and
   a preformed blank having a surface area no larger than a size of said at least one die, placed over said active side of said at least one die and including apertures formed therein through which said external connections of said at least one die are accessible, wherein at least some of said apertures are placed in said blank at locations remote from said external electrical connections, having bond pads formed under said apertures at said remote locations arranged adjacent an edge of said package, and including a trench in an exposed side of said blank extending from at least some of said remote bond pad apertures toward said package edge.

29. The package of claim 28, further including circuit traces extending from said external electrical connections to said remote aperture locations.

30. The package of claim 29, wherein said circuit traces are at least partially formed on said active surface of said at least one die.

31. The package of claim 29, wherein said circuit traces are at least partially formed on said blank.

32. The package of claim 29, further including bond pads formed under said apertures at said remote locations.

33. The package of claim 29, further including remote external connection elements at said remote locations adjacent an edge of said package.

34. The package of claim 31, wherein said circuit traces are at least partially formed on a side of said blank adjacent said at least one die.

35. The package of claim 31, wherein said circuit traces are at least partially formed on an exposed side of said blank.

36. The package of claim 35, wherein said circuit traces are at least partially formed in trenches.

37. The package of claim 32, wherein said remote locations are arranged adjacent an edge of said package.

38. The package of claim 37, further including a trench in an exposed side of said blank extending from at least some of said remote bond pad apertures toward said package edge.

39. The package of claim 33, wherein said remote external connection elements comprise metallized trenches in an exposed side of said blank.

40. The package of claim 39, wherein said trenches extend to said external connections of said at least one die, define said circuit traces, and communicate with said external connections of said at least one die.

41. A chip scale package for a semiconductor die, comprising:
   at least one semiconductor die including an integrated circuit having external electrical connections on an active side thereof; and
   a preformed blank having a surface area no larger than a size of said at least one die, placed over said active side of said at least one die and including apertures formed therein through which said external connections of said at least one die are accessible, wherein at least some of said apertures are placed in said blank at locations remote from said external electrical connections, having remote external connection elements at said remote locations adjacent an edge of said package, wherein said remote external connection elements comprise metallized trenches in an exposed side of said blank with circuit traces extending from said external electrical connections to said remote aperture locations.

42. The package of claim 41, further including circuit traces that are at least partially formed on said active surface of said at least one die.

43. The package of claim 41, wherein said circuit traces are at least partially formed on a side of said blank adjacent said at least one die.

44. The package of claim 41, wherein said circuit traces are at least partially formed on an exposed side of said blank.

45. The package of claim 41, further including bond pads formed under said said remote locations.

46. The package of claim 41, wherein said trenches extend to said external of said at least one die, define said circuit traces, and communicate with said connections of said at least one die.

47. The package of claim 42 wherein said circuit traces are at least partially formed in trenches.

48. The package of claim 41, wherein said remote locations are arranged adjacent said package.

49. The package of claim 45, further including a trench in an exposed side of said blank extending from at least some of said remote bond pad apertures toward said package edge.

* * * * *

UNITED STATES PATENT AND TRADEMARK OFFICE
CERTIFICATE OF CORRECTION

PATENT NO.   : 6,072,236
DATED        : June 6, 2000
INVENTOR(S)  : Akram et al.

It is certified that error appears in the above-identified patent and that said Letters Patent is hereby corrected as shown below:

Title page,
Item [56], References Cited, U.S. PATENT DOCUMENTS, change "Hambree" to -- Hembree --; and
Item [74], *Attorney, Agent, or Firm*, change "Task," to -- Trask, --.

Column 1,
Line 35, delete "the" before "thermal" and after "of" and before "die" insert -- the --;

Column 2,
Line 27, change "(DOC)" to -- (DDC ) --;
Line 43, delete "Tab Automated Bonding";
Line 44, after "or" insert -- Tab Automated Bonding --;

Column 3,
Line 42, change "(CM)" to -- (MCM) --;
Line 43, change "(Same)" to -- (SIMM) --;

Column 5,
Lines 28, 31 and 37, change "wafer-sized" to -- wafer-size --;
Lines 39, 42 and 44, change "wafer" to -- wafer-size --;
Line 66, change "face side" to -- active surface --;

Column 6,
Line 8, change "imitations" to -- limitations --;

Column 7,
Line 36, after "blank" insert -- , --;
Line 48, change "surface" to -- side --;

Column 8,
Lines 13 and 36, after "blank" insert -- , --;
Line 20, change "die" to -- electrical --;
Line 46, change "surface" to -- side --;
Line 65, change "25" to -- 26 --;

UNITED STATES PATENT AND TRADEMARK OFFICE
CERTIFICATE OF CORRECTION

PATENT NO. : 6,072,236
DATED : June 6, 2000
INVENTOR(S) : Akram et al.

It is certified that error appears in the above-identified patent and that said Letters Patent is hereby corrected as shown below:

Column 9,
Line 6, after "blank" insert -- , --;
Line 22, change "surface" to -- side --;
Lines 26-27, please cancel claim 32;
Line 30, change "an" to -- said --;
Lines 38-42, please cancel claims 37 and 38;

Column 10,
Line 10, after "blank" insert -- , --;
Lines 16-17, change "having" to -- and further including --;
Line 23, change "further including" to -- wherein said --;
Line 24, delete "that" and change "surface" to -- side --;
Line 32, after "said" (first occurrence) insert -- apertures at --;
Line 34, after "external" insert -- electrical connections --;
Line 35, after "with said" insert -- external electical --;
Line 38, after "in" insert -- said --; and
Line 40, after "adjacent" insert -- said edge of --.

Signed and Sealed this

Thirty-first Day of May, 2005

JON W. DUDAS
*Director of the United States Patent and Trademark Office*